US012597472B2

(12) United States Patent
Raghunathan et al.

(10) Patent No.: US 12,597,472 B2
(45) Date of Patent: Apr. 7, 2026

(54) SELECTIVELY ERASING ONE OF MULTIPLE ERASE BLOCKS COUPLED TO A SAME STRING USING GATE INDUCED DRAIN LEAKAGE

(71) Applicant: Micron Technology, Inc., Boise, ID (US)

(72) Inventors: Shyam Sunder Raghunathan, Woodlands (SG); Yingda Dong, Los Altos, CA (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 18/768,970

(22) Filed: Jul. 10, 2024

(65) Prior Publication Data

US 2025/0087275 A1 Mar. 13, 2025

Related U.S. Application Data

(60) Provisional application No. 63/537,920, filed on Sep. 12, 2023.

(51) Int. Cl.
| | |
|---|---|
| *G11C 16/34* | (2006.01) |
| *G11C 16/04* | (2006.01) |
| *G11C 16/16* | (2006.01) |
| *G11C 16/28* | (2006.01) |

(52) U.S. Cl.
CPC .......... *G11C 16/16* (2013.01); *G11C 16/0483* (2013.01); *G11C 16/28* (2013.01); *G11C 16/34* (2013.01)

(58) Field of Classification Search
CPC ..................................................... G11C 16/34
See application file for complete search history.

(56) References Cited

U.S. PATENT DOCUMENTS

| | | | |
|---|---|---|---|
| 7,177,977 B2 | 2/2007 | Chen | |
| 8,542,530 B2 | 9/2013 | Hemink | |
| 9,786,375 B2 | 10/2017 | Goda | |
| 10,229,740 B2 | 3/2019 | Cai | |
| 2020/0167274 A1 | 5/2020 | Bahirat et al. | |
| 2021/0174887 A1* | 6/2021 | Sanada | .............. G11C 16/0483 |

OTHER PUBLICATIONS

Goda, et al., U.S. Appl. No. 18/386,746, filed Nov. 3, 2023.
Goda, et al., U.S. Appl. No. 18/386,760, filed Nov. 3, 2023.
Hubbard, et al., U.S. Appl. No. 18/606,670, filed Mar. 15, 2024.
Hubbard, et al., U.S. Appl. No. 18/606,742, filed Mar. 15, 2024.

* cited by examiner

*Primary Examiner* — Jason Lappas
(74) *Attorney, Agent, or Firm* — _Brooks, Cameron & Huebsch, PLLC

(57) ABSTRACT

An apparatus can comprise a memory array comprising a plurality of strings of memory cells. A first string of the plurality of strings can comprises: a first group of memory cells coupled to a first group of access lines and corresponding to a first erase block; and a second group of memory cells coupled to a second group of access lines and corresponding to a second erase block. A controller is coupled to the memory array and configured to, in order to selectively erase the second erase block independently of the first erase block: apply a voltage having a first value to a sense line coupled to the plurality of strings; apply a voltage having a second value less than the first value to the first group of access lines; and apply a voltage having a third value less than the second value to the second group of access lines.

20 Claims, 7 Drawing Sheets

Figure 6:
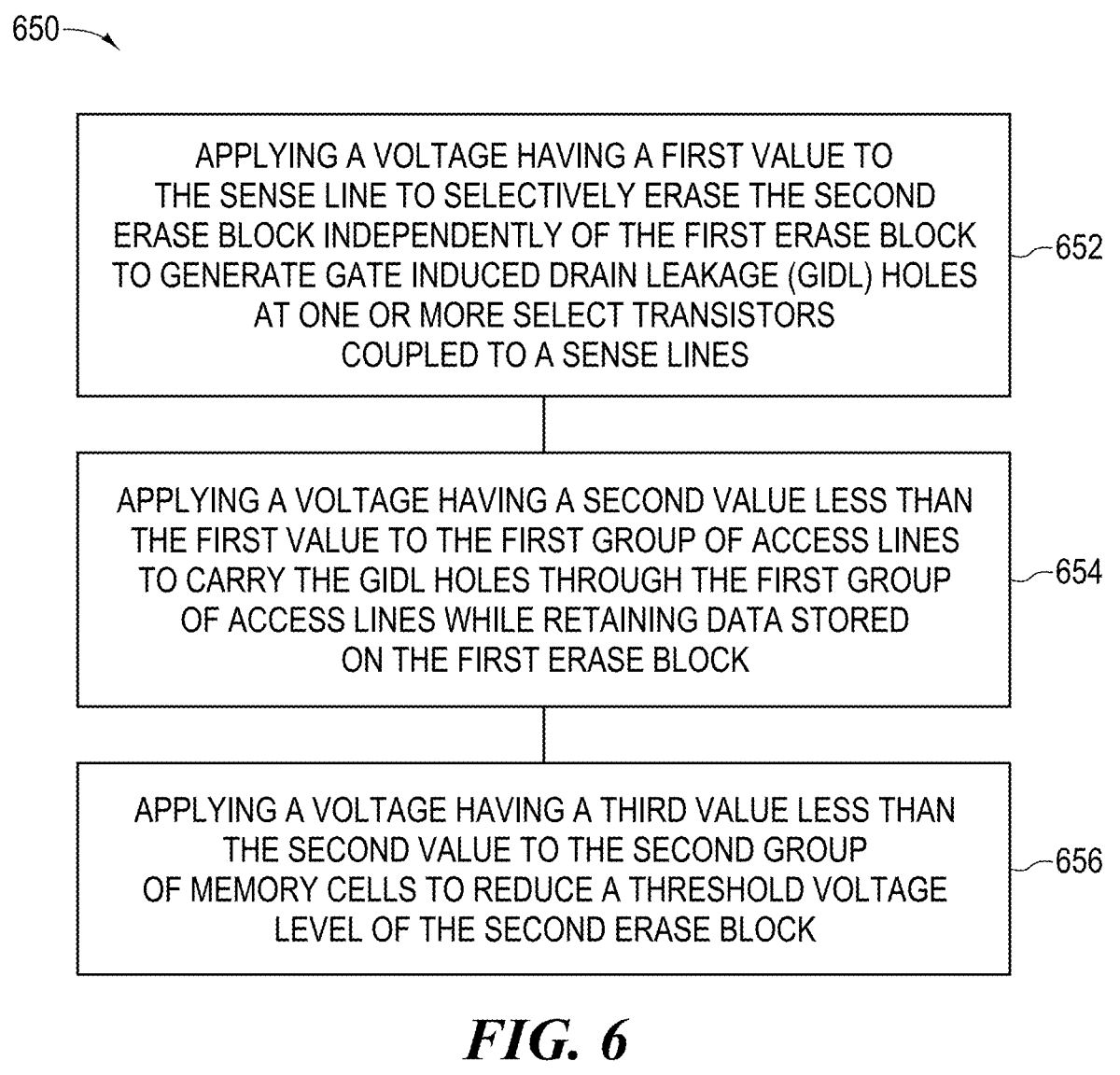

650

APPLYING A VOLTAGE HAVING A FIRST VALUE TO
THE SENSE LINE TO SELECTIVELY ERASE THE SECOND
ERASE BLOCK INDEPENDENTLY OF THE FIRST ERASE BLOCK
TO GENERATE GATE INDUCED DRAIN LEAKAGE (GIDL) HOLES
AT ONE OR MORE SELECT TRANSISTORS
COUPLED TO A SENSE LINES

652

APPLYING A VOLTAGE HAVING A SECOND VALUE LESS THAN
THE FIRST VALUE TO THE FIRST GROUP OF ACCESS LINES
TO CARRY THE GIDL HOLES THROUGH THE FIRST GROUP
OF ACCESS LINES WHILE RETAINING DATA STORED
ON THE FIRST ERASE BLOCK

654

APPLYING A VOLTAGE HAVING A THIRD VALUE LESS THAN
THE SECOND VALUE TO THE SECOND GROUP
OF MEMORY CELLS TO REDUCE A THRESHOLD VOLTAGE
LEVEL OF THE SECOND ERASE BLOCK

SELECTIVELY ERASING ONE OF MULTIPLE ERASE BLOCKS COUPLED TO A SAME STRING USING GATE INDUCED DRAIN LEAKAGE

PRIORITY INFORMATION

This application claims the benefits of U.S. Provisional Application No. 63/537,920, filed on Sep. 12, 2023, the contents of which are incorporated herein by reference.

TECHNICAL FIELD

Embodiments of the disclosure relate generally to memory systems, and more specifically, relate to apparatuses and methods for selectively erasing one of multiple erase blocks coupled to a same string using gate induced drain leakage (GIDL).

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 6 is a flow diagram that illustrates an example method for selectively erasing one of multiple erase blocks coupled to a same string using gate induced drain leakage (GIDL) in accordance with various embodiments of the present disclosure.

DETAILED DESCRIPTION

Figure 1:
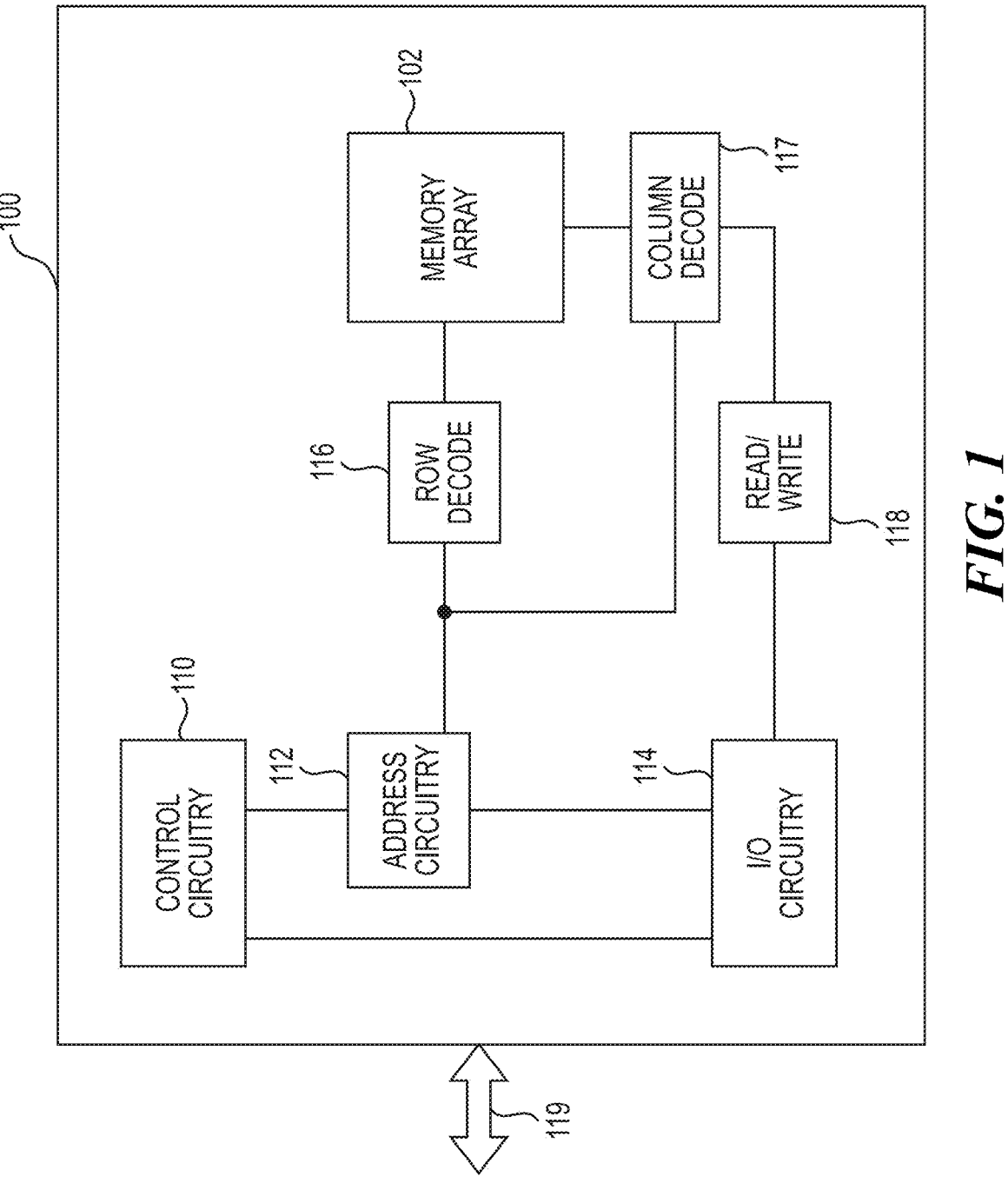
FIG. 1 illustrates an example portion of a memory system including a memory device having an array in accordance with various embodiments of the present disclosure.

Aspects of the present disclosure are directed to apparatuses and for selectively erasing one of multiple erase blocks coupled to a same string using gate induced drain leakage (GIDL). Various types of memory, such as NAND flash memory, include a memory array of many memory cells that can be arranged in row and column fashion and grouped in physical blocks. The cells can include a storage node such as a floating gate or charge-trap layer which allows the cells to be programmed to store one or more bits by adjusting the charge on the storage node. Generally, an erase operation (e.g., a "block erase") is performed to erase all of the cells of a block together as a group.

Three-dimensional (3D) flash memory (e.g., a 3D NAND memory array) can include multiple strings of memory cells with each string comprising multiple series-coupled (e.g., source to drain) memory cells in a vertical direction, with the memory cells of a string sharing a common channel region. Each memory cell of a string can correspond to a different tier of the memory array, with a group of strings sharing multiple access lines, which may be referred to as word lines (WLs). Each access line can be coupled to respective memory cells of each string in the group of strings (e.g., the memory cells of a particular tier of the memory array). Groups of strings are coupled to respective sense lines, which may be referred to as data lines or bit lines (BLs), of a group of sense lines. The cells of the strings can be positioned between a drain-side select gate (referred to as a select gate drain (SGD)) and a source-side select gate (referred to as select gate source (SGS)) used to control access to the strings.

A 3D memory array can comprise multiple blocks each comprising a plurality of memory pages (e.g., physical pages of cells that can store one or more logical pages of data). In various previous approaches, a block of memory cells corresponds to a smallest group of memory cells that can be erased. In one example, NAND memory cells of a 3D memory array are erased by generating gate induced drain leakage (GIDL) holes and having the GIDL holes to flow (e.g., be carried) through the strings. During erase, the GIDL holes may tunnel from the strings to a charge storage region of memory cells, which lowers their threshold voltage (Vt) levels.

In some approaches, the GIDL holes can be generated at either end of the NAND string. For example, some GIDL holes may be generated between two terminals of a select transistor (e.g., drain-side select transistor) that is connected to a bit line (BL), while some GIDL holes may be generated between two terminals of a select transistor (e.g., source-side select transistor) that is connected to a source line. However, GIDL hole-generation on the source line side may be less effective and/or harder to control to be used for erase operations since manufacturing of the 3D memory array may pose challenges for controlling the doping of the source region. Typically, the source region is doped before building the pillar, while the drain side is implanted and tuned after pillar construction. This difference in the timing of doping can make it more difficult to control the implant on the source region. Moreover, the thermally diffused doping into the GIDL gate on the source side lead to a diffuse junction with low electric fields, diminishing the effectiveness of GIDL. Consequently, the processing constraints may limit the effectiveness of GIDL hole-generation on the source side, making it less effective for erasing blocks than using GIDL holes generated at the BL side.

Various embodiments of the present disclosure address the above and other deficiencies by providing apparatus and methods that can selectively erase one of multiple erase blocks using GIDL holes generated at the BL side without depending on GIDL holes generated at the source side. As used herein, an "erase block" refers to a group of cells that are configured to be erased together as a group and that share a same string as one or more additional groups of cells (e.g., one or more additional erase blocks). An erase block may also be referred to as a "deck."

In embodiments of the present disclosure, erasing erase blocks via GIDL holes supplied from one side of the array involves applying various voltages to selected (for erase operations) and/or unselected word lines to allow GIDL holes to travel through strings to ultimately cause the GIDL holes to tunnel into memory cells of (e.g., coupled to) the selected word line, while further blocking GIDL holes from being tunneled from the strings into memory cells of the unselected word lines. For example, an erase block that is not adjacent to either side of the array can be erased using GIDL holes generated from the one side of the array, while GIDL holes tunneled into memory cells of the erase block can be further blocked on the other end such that data stored on an erase block adjacent to the other side of the array can be retained.

FIG. 1 illustrates an example portion of a memory system including a memory device 100 having an array 102 in accordance with various embodiments of the present disclosure. The memory array 102 can be a 3D NAND array such as described further in association with FIG. 2, for example. The array can comprise single level cells (SLCs) storing 1 bit per cell, multilevel cells (MLCs) storing 2 bits per cell, triple level cells (TLCs) storing three bits per cell, or quad level cells (QLCs) storing 4 bits per cell, for example. Embodiments are not limited to a particular type of memory cell. The memory device 100 can be part of a memory system such as memory system 790 described in FIG. 7.

The memory device 100 includes control circuitry 110, address circuitry 112, input/output (I/O) circuitry 114 used to communicate with an external device via an interface 119, which may be a bus used to transmit data, address, and control signals, among other signals between the memory device 100 and an external host device, which can include a controller, host processor, etc., that is capable of accessing the memory array 102. The interface 119 can include a combined address, control, and data bus or separate busses depending on the particular physical interface and corresponding protocol. The interface 119 can be an Open NAND Flash Interface (ONFI) interface or a Non-Volatile Memory Express (NVMe) interface; however, embodiments are not limited to a particular type of interface or protocol.

The control circuitry 110 can decode signals (e.g., commands) received via interface 119 and executed to control operations performed on the memory array 102. The operations can include data programming operations, which may be referred to as write operations, data read operations, which may be referred to as sensing operations, data erase operations, etc. The control circuitry 110 can cause various groups of memory cells (e.g., pages, blocks, erase blocks, etc.) to be selected or deselected in association with performing memory operations on the array 102. The control circuitry 110 can comprise a state machine, a sequencer, and/or some other type of control circuitry, which may be implemented in the form of hardware, firmware, or software, or any combination thereof.

The I/O circuitry 114 is used for bi-directional communication of data between the memory array 102 and the external host via interface 119. The address circuitry 112, which can include a register, can latch address signals received thereto, and the address signals can be decoded by a row decoder 116 and a column decoder 117 to access the memory array 102. The memory device 100 includes read/write circuitry 118 used to read data from and write data to the memory array 102. As an example, the read/write circuitry can include various latch circuitry, drivers, sense amplifiers, buffers, etc. Data can be read from the memory array 102 by sensing voltage and/or current changes on bit lines of the memory array 102.

Figure 2:
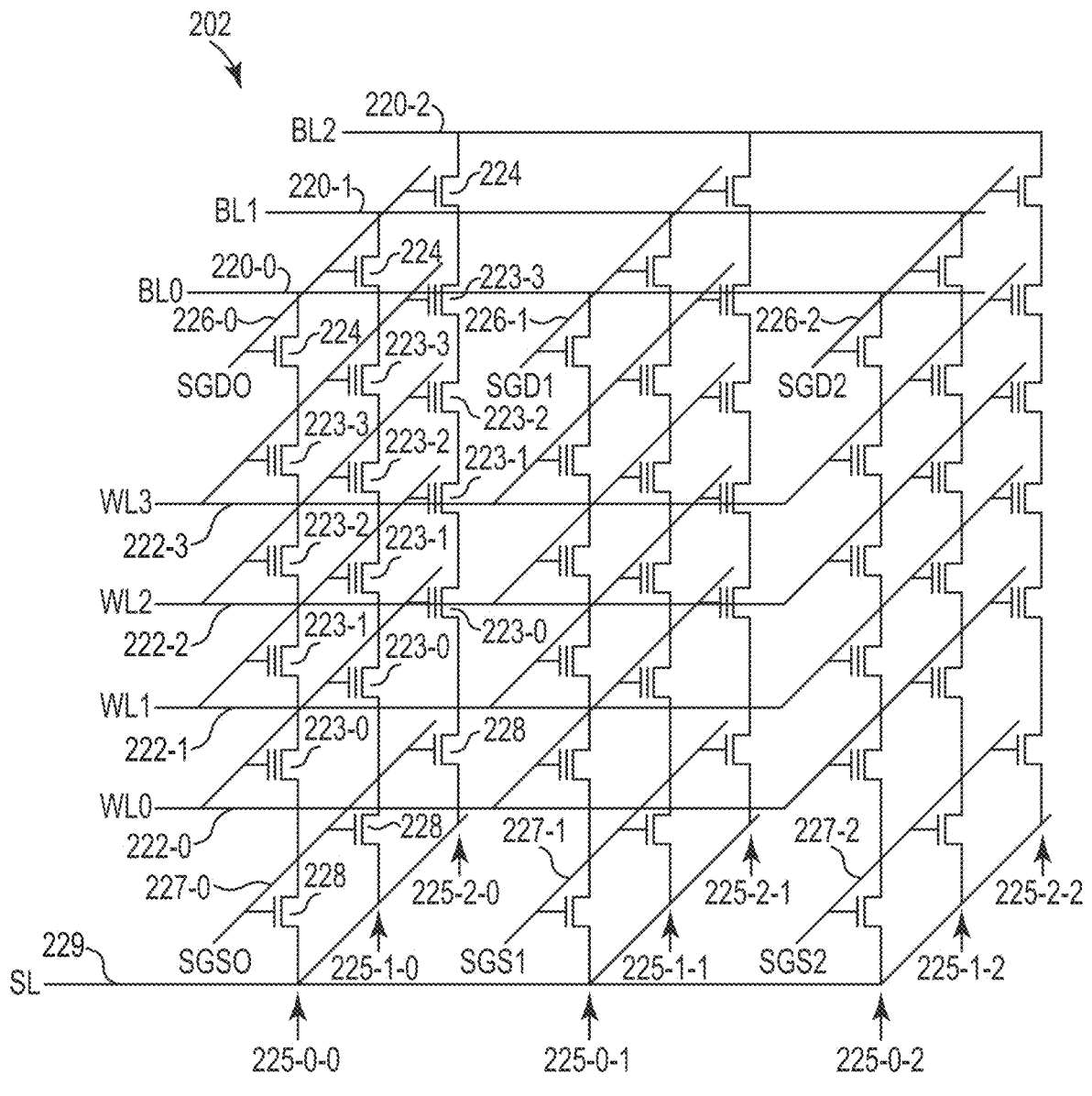
FIG. 2 is a schematic diagram illustrating an example memory array in accordance with various embodiments of the present disclosure.

FIG. 2 is a schematic diagram illustrating an example memory array 202 in accordance with various embodiments of the present disclosure. The memory array 202 can be located in a memory device such as memory device 100 described in FIG. 1, for example. The memory array 202 is a 3D NAND array.

The memory array 202 comprises a number of access lines (word lines) 222-0 (WL0), 222-1 (WL1), 222-2 (WL2), and 222-3 (WL3) and a number of sense lines (bit lines) 220-0 (BL0), 220-1 (BL1), and 220-2 (BL2) coupled to multiple strings 225-0-0, 225-0-1, 225-0-2, 225-1-0, 225-1-1, 225-1-2, 225-2-0, 225-2-1, and 225-2-2. The word lines, bit lines, and strings are collectively referred to as word lines 222, bit lines 220, and strings 225, respectively. Although four word lines 222, three bit lines 220, and nine strings 225 are shown, embodiments are not so limited.

Each of the strings 225 comprises a number of memory cells (referred to collectively as memory cells 223) located between a select transistor 224 and a select transistor 228. For example, as shown in FIG. 2, strings 225-0-0, 225-1-0, and 225-1-2 each respectively comprise memory cells 223-0, 223-2, 223-2, and 223-3 located between select transistors 224 and 228 (e.g., respective drain-side select gate (SGD) 224 and source-side select gate (SGS) 228). The memory cells 223 can be floating gate or charge-trap transistors with the cells 223 of a given string 225 sharing a common channel region (e.g., pillar). As shown, the memory cells 223 of a given string are series-coupled source to drain between the SGD transistor 224 and the SGS.

The memory cells 223 of the strings 225 are stacked vertically such that they are located on distinct tiers/levels of the memory array 202. Each word line 222 can be commonly coupled to all the memory cells at a particular tier/level. For example, word line 222-0 can be coupled to (e.g., as the control gate) the nine memory cells 223-0 corresponding to the nine respective strings 225.

The select transistors 224 and 228 can be controlled (e.g., turned on/off) via the corresponding select gate signals SGD0, SGD1, SGD2, SGS0, SGS1, and SGS2 in order to couple the strings 225 to their respective bit lines 220 and a common source line (SL) 229 during memory operations (e.g., reads, writes, erases). As shown in FIG. 2, the select gate signals SGD0, SGD1, and SGD2 are provided (e.g., to the gates of transistors 224) via respective conductive lines 226-0, 226-1, and 226-2, and the select gate signals SGS0, SGS1, and SGS2 are provided (e.g., to the gates of transistors 228) via respective conductive lines 227-0, 227-1, and 227-2. Although the signals SGS0, SGS1, and SGS2 are shown on separate conductive lines 227, in some embodiments the conductive lines 227-0, 227-1, and 227-2 may be coupled via a common SGS line.

To perform memory operations on the array 202, particular voltages can be applied to the word lines 222, bit lines 220, and/or source line 229. The particular voltages applied depends on the memory operation being performed, and different voltages may be applied to the word lines 222 during a particular memory operation in order to store data in a cell (or page of cells) or read data from a cell. For example, a write operation to store data in a selected memory cell 223-2 of string 225-0-0 (shown within a dashed circle) selected to store information into memory cell 223 can involve applying a voltage (e.g., a programming voltage) to the word line 222-2 corresponding to the selected cell 223-2 and other voltages to the word lines (222-0, 222-1, and 222-3) coupled to non-selected cells (222-0, 222-1, and 222-4) (e.g., the memory cells not being programmed).

An erase operation to erase data stored on a selected group of memory cells (e.g., a selected erase block as described further below) can utilize GIDL holes generated at respective select transistors 224. For example, GIDL holes can be generated by applying a relatively high voltage (e.g., 20V) to the respective bit line 229 to generate GIDL holes at select transistors 224. The generated GIDL holes can be induced to travel through the respective strings 225 and tunnel into memory cells of the selected erase block, which results in erasing of the cells of the selected erase block; thereby reducing their Vt levels to near 0V, for example. Furthermore, a relatively high voltage equivalent to or substantially equivalent to (e.g., but less than) the voltage applied to the respective bit line 229 can be respectively applied to word lines 222 of unselected erase block(s) to prevent GIDL holes from either being carried through those portions of the strings 225 corresponding to unselected erase blocks or tunneled into memory cells 223 of unselected erase blocks. Further details of the erase operation are described in connection with FIGS. 4-5.

The memory cells 223 of the array 202 can represent a physical block of memory cells that can comprise multiple (e.g., two or more) physical erase blocks. As an example, the word lines 222-0 and 222-1 can be coupled to cells of a first erase block, and the word lines 222-2 and 222-3 can be coupled to cells of a second/different erase block. Therefore, the cells 223-0 and 223-1 of the nine respective strings 225 (e.g., the cells of the first erase block) share respective common strings with the cells 223-2 and 223-3 (e.g., the cells of the second erase block).

As further described herein, an array (e.g., 202) can comprise a number of word lines physically between (e.g., separating) the word lines (e.g., 222) corresponding to different erase blocks. The word lines separating word lines corresponding to different erase blocks can be referred to as "dummy" word lines and can be coupled to dummy memory cells (e.g., within the strings 225) that are not used to store data. The dummy word lines and/or dummy cells can facilitate the ability to perform erase operations separately on erase blocks that share a common string or strings. The quantity of dummy word lines between erase blocks can vary, and various bias voltages can be applied to the dummy word lines during the various memory operations performed on the erase blocks.

Figure 3:
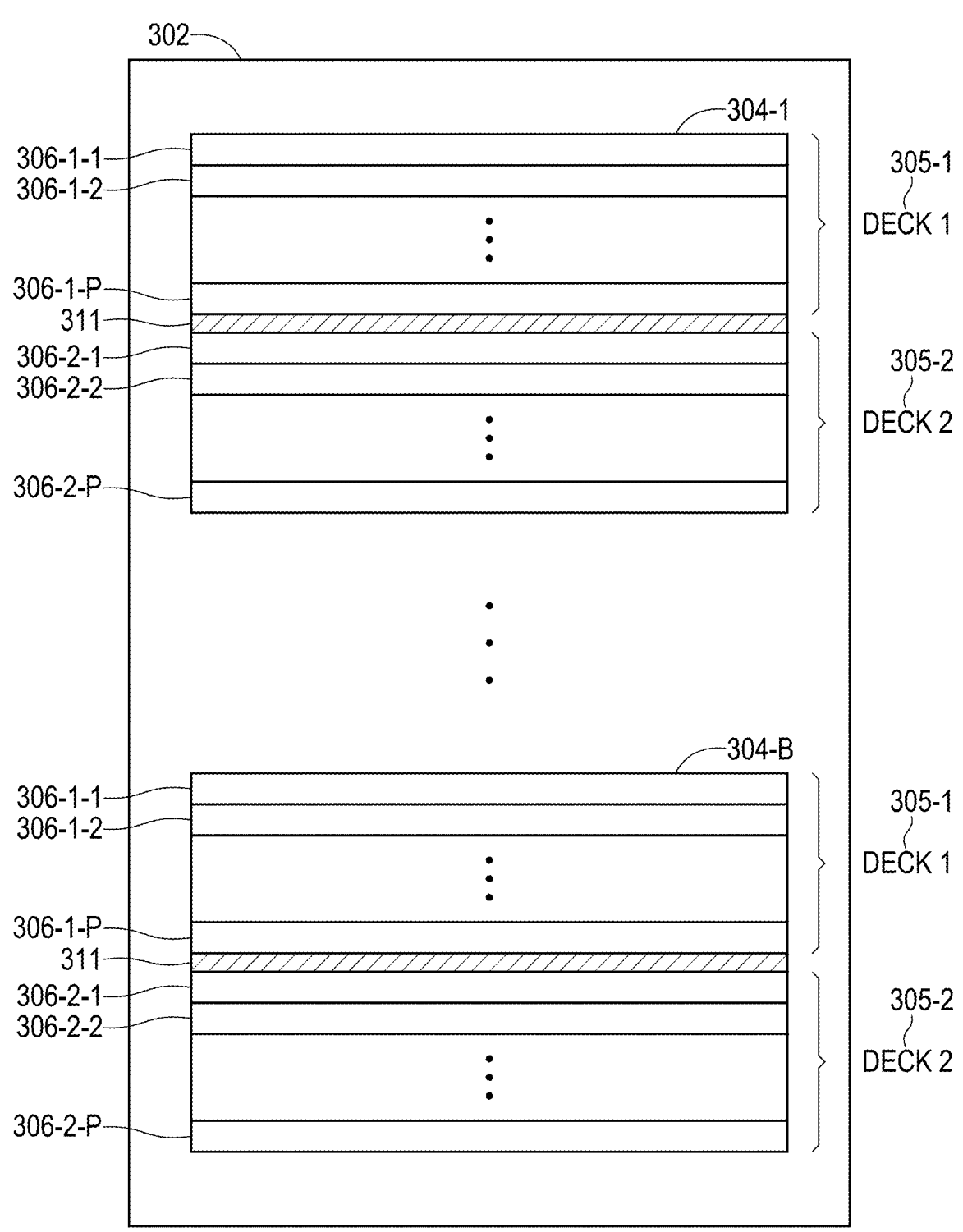
FIG. 3 illustrates a portion of a memory array having multiple erase blocks per string in accordance with various embodiments of the present disclosure.

FIG. 3 illustrates a portion of a memory array 302 having multiple erase blocks per string in accordance with various embodiments of the present disclosure. The memory array 302 includes multiple physical blocks 304-1, . . . , 304-B and can be operated in accordance with one or more embodiments of the present disclosure. The indicator "B" is used to indicate that the array 302 can include a number of physical blocks 304. As an example, the number of physical blocks in array 302 can be 128 blocks, 512 blocks, or 1,024 blocks, but embodiments are not limited to a particular multiple of 128 or to any particular number of physical blocks in an array 302. The memory array 302 can be, for example, a NAND flash memory array (e.g., a 3D NAND flash array such as array 102 and/or 202).

Each of the physical blocks 304-1, . . . , 304-B includes a first erase block 305-1 (DECK_1) and a second erase block 305-2 (DECK_2) separated by a region 311. The region 311 can comprise "dummy" word lines, for example. Although the region 311 is illustrated as not being part of the decks 305-1 and 305-2, embodiments are not so limited. For example, the region 311 can be considered as part of the deck 305-1 or 305-2. As described above, the decks 305-1 and 305-2 are commonly coupled to the strings of the blocks 304-1, . . . , 304-B with the decks 305-1 and 305-2 being separately erasable via a block erase operation (e.g., deck 305-1 can be erased without erasing deck 305-2 and vice versa). Although each physical block 304 is illustrated as having two erase blocks (e.g., erase blocks 305-1 and 305-2), embodiments are not so limited. For example, each physical block 304 can include more than two erase blocks (e.g., three erase blocks) that are commonly coupled to the strings of the respective block with each one of the three erase blocks being separately erasable, which is further described in detail in association with FIG. 5.

Each deck 305-1 and 305-2 can comprise a number of physical pages, which can correspond to a "row" of the array corresponding to a particular word line. As shown, deck 305-1 comprises pages 306-1-1, 306-1-2, . . . , 306-1-P, and deck 305-2 comprises pages 306-2-1, 306-2-2, . . . , 306-2-P. The designator "P" is used to indicate that the decks 305-1 and 305-2 can comprise a plurality of pages/rows. Each physical page (collectively referred to as pages 306) can store multiple logical pages of data. A page can refer to a unit of programming and/or reading (e.g., a group of cells that are programmed and/or read together as a functional group).

Figure 4:
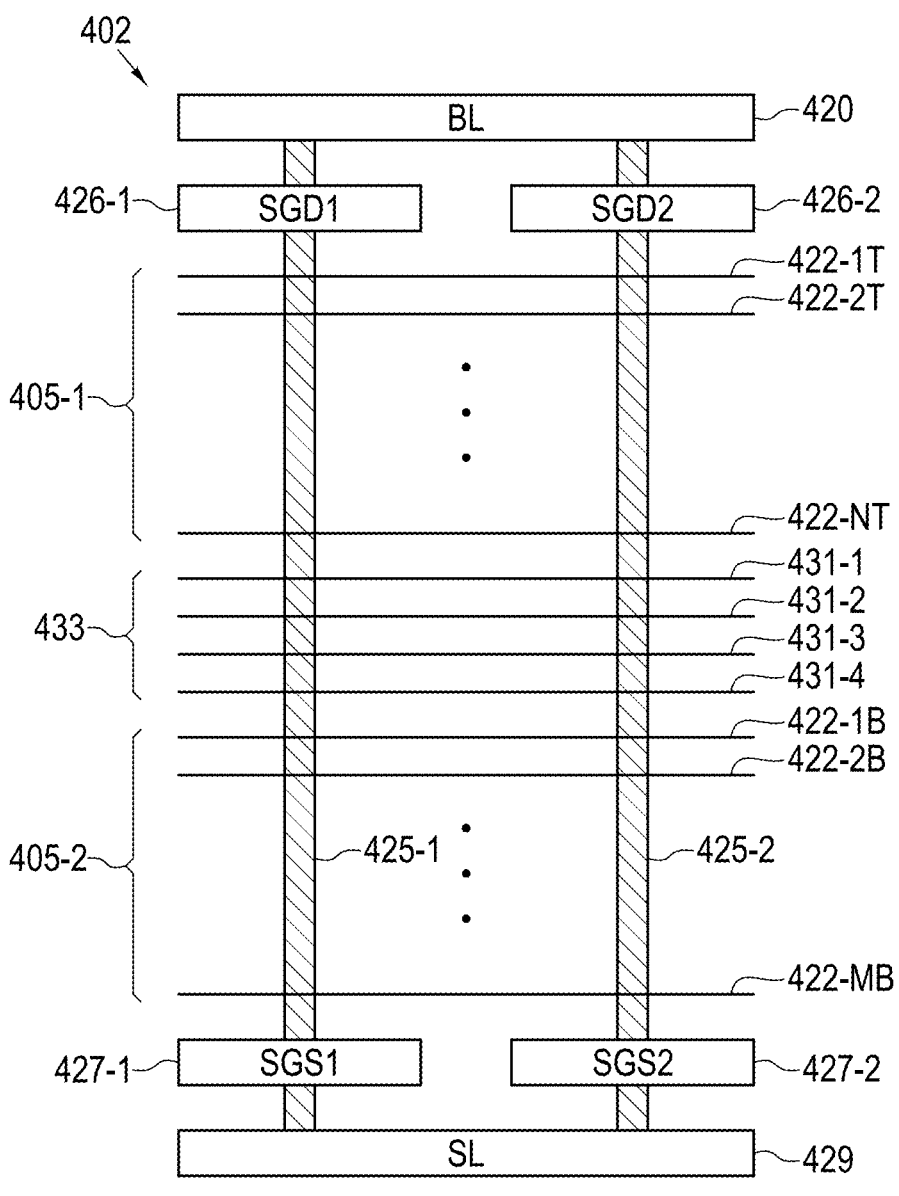
FIG. 4 schematically illustrates an example portion of a memory array having multiple erase blocks per string in accordance with various embodiments of the present disclosure.

FIG. 4 schematically illustrates an example portion of a memory array 402 having multiple (e.g., 2) erase blocks per string in accordance with various embodiments of the present disclosure. The example shown can be a portion of the array 202 described in FIG. 2. The array portion 402 can be a portion of a physical block of memory cells that includes multiple erase blocks (e.g., decks).

In this example, the array 402 includes a plurality/group of word lines 422-1T, 422-2T, . . . , 422-NT corresponding to a first erase block 405-1 (e.g., a top deck) and a plurality/group of word lines 422-1B, 422-2B, . . . , 422-MB corresponding to a second erase block 405-2 (e.g., bottom deck). Although each the array 402 is illustrated as having two erase blocks (e.g., erase blocks 405-1 and 405-2), embodiments are not so limited. For example, the array 402 can include more than two erase blocks (e.g., three erase blocks) that are commonly coupled to the strings of the respective block with each one of the three erase blocks being separately erasable, which is further described in detail in association with FIG. 5.

The designators "N" and "M" can represent various numbers (e.g., 3 or more) and "N" and "M" can be the same number. Accordingly, embodiments are not limited to a particular quantity of word lines 422 for the top deck 405-1 or bottom deck 405-2 (the designator "T" corresponding to "top" and the designator "B" corresponding to "bottom"). The array 402 also includes a number of dummy word lines 431-1, 431-2, 431-3, and 431-4, which can be collectively referred to as word lines 431. The dummy word lines 431 correspond to a separation region 433 between the top deck 405-1 and bottom deck 405-2. Although four word lines 431 are illustrated, embodiments can include more or fewer than four dummy word lines 431 separating erase blocks corresponding to same strings. Further, although the separation region 433 is illustrated as not being part of the decks 405-1 and 405-2, embodiments are not so limited. For example, the region 433 can be considered as part of the deck 405-1 or 405-2.

The array portion 404 illustrates two strings 425-1 and 425-2 for ease of illustration; however, embodiments can include many more strings 425. Memory cells are located at the intersections of the word lines 422/431 and strings 425, with the memory cells of a particular string 425 sharing a common channel region (e.g., pillar) as described in FIG. 2. The dummy word lines 431 can be coupled to dummy memory cells (e.g., cells that are not addressable to store user data).

As illustrated in FIG. 4, a first end of the strings 425-1 and 425-2 can be coupled to a common source line 429 via respective select gate source lines 427-1 (SGS1) and 427-2 (SGS2). The second/opposite end of the strings 425-1 and 425-2 can be coupled to a bit line 420 via respective select gate drain lines 426-1 (SGD1) and 426-2 (SGD2). As such, the strings 425 (e.g., the cells thereof) can be individually accessed using the bit line 420 and select gates to which the lines 426-1 and 426-2 are coupled. Although only a single bit line 420 is shown, embodiments can include multiple bit lines such as shown in FIG. 2, for example.

As noted herein, in various embodiments, the top deck 405-1 and the bottom deck 405-2 can be erased via separate erase operations even though the cells of the decks 405-1/ 405-2 share the same strings 425-1/425-2. For example, an erase operation can be performed on the cells coupled to word lines 422-1T to 422-NT without erasing the cells coupled to the word lines 422-1B to 422-MB, and vice versa. Similarly, each one of the decks 405-1 and 405-2 can be individually programmed and/or read without programming or reading the other of the decks 405-1 and 405-2.

An erase operation performed on a deck 405-1 or 405-2 can include generating GIDL holes at select transistors (e.g., select transistors 224 illustrated in FIG. 2) coupled to SGDs 426-1 and 426-2. For example, GIDL holes can be generated by applying a relatively high voltage (e.g., 20V) to the bit line 420. The GIDL holes can be carried through the strings (e.g., strings 425-1 and 425-2) and tunneled to (e.g., charge storage regions) of the memory cells of the selected deck 405-1 or 405-2. Since GIDL holes are generated at a particular side of the array 402 (e.g., at the "bit line-side" of the array 402), GIDL holes may need to travel through (e.g., portions of the strings 425-1 and 425-2 that correspond to) the unselected deck. For example, if the deck 405-2 is to be erased using GIDL holes from the BL (e.g., SGD) side, GIDL holes may need to travel through (e.g., portions of the strings 425-1 and 425-2 that correspond to) the unselected deck 405-1. To carry GIDL holes through the unselected deck and to still retain data stored on the unselected deck (e.g., the deck 405-1), a voltage whose voltage level is not "too high" and not "too low" can be applied to word lines 422 of the unselected deck. The voltage level is not "too high" as it is sufficiently low enough to allow GIDL holes to travel through those portions of the strings 425-1 and 425-2 corresponding to the unselected deck. The voltage level is not "too low" as it is sufficiently high enough to block GIDL holes that have been traveling through the strings 425-1 and 425-2 from being tunneled into memory cells of the unselected deck.

In one example, an erase operation performed on a selected deck 405-1 can include applying a relatively high voltage (e.g., 20V) to the bit line 420, applying relatively low voltages (e.g., 0.5V) to the selected word lines 422-1T to 422-NT of the selected deck 405-1, and applying relatively high voltages (e.g., 16 or 20V) to the word lines 422-1B to 422-MB of the unselected deck 405-2. A voltage level of the relatively high voltages (e.g., applied to the word lines 422-1B to 422-MB) can be sufficiently high enough to block GIDL holes generated at select transistors coupled to the SGDs 426-1, 426-2 or the SGSs 427-1, 427-2 from being carried through those portions of the strings 425-1 and 425-2 coupled to the word lines 422-1B to 422-MB; thereby, retaining data stored on the unselected deck 405-2.

In a different example, an erase operation performed on a selected deck 405-2 can include applying a relatively high voltage (e.g., 20V) to the bit line 420, applying relatively high voltages (e.g., 16V) to the word lines 422-1T to 422-NT of the unselected deck 405-1, and applying low voltages (e.g., 0.5V) to the word lines 422-1B to 422-1MB of the selected deck 405-2. The relatively high voltages (e.g., 16V) can be sufficiently high enough to block GIDL holes (that have been traveling through the strings 425-1 and 425-2) from being tunneled into memory cells of the unselected deck 405-1 (thereby, retaining data stored on the unselected deck 405-1), while allowing GIDL holes to be carried through the strings 425-1 and 425-2.

Figure 5:
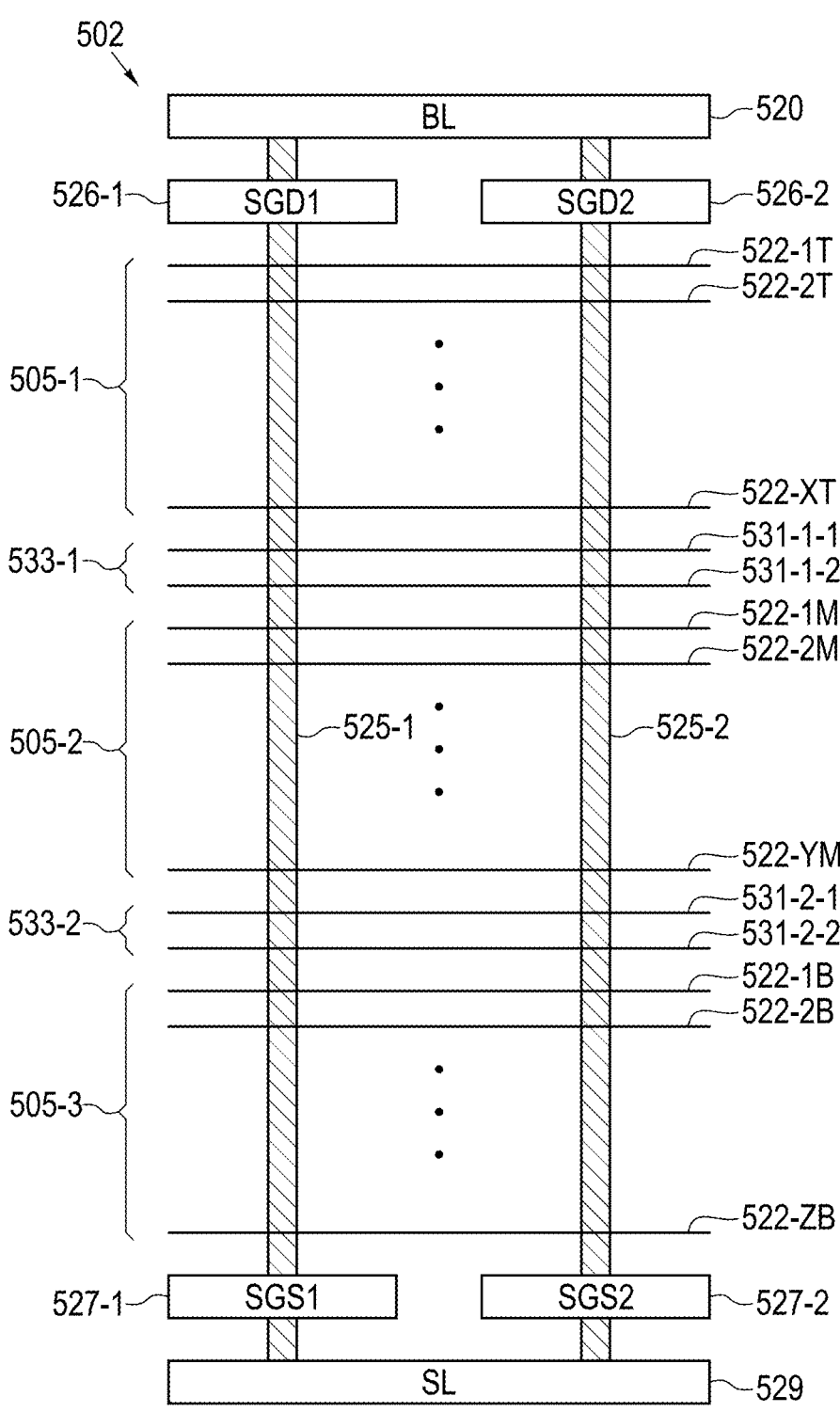
FIG. 5 schematically illustrates another example portion of a memory array having multiple erase blocks per string in accordance with various embodiments of the present disclosure.

FIG. 5 schematically illustrates another example portion of a memory array 502 having multiple (e.g., 3) erase blocks (e.g., decks) per string in accordance with various embodiments of the present disclosure. The example shown can be a portion of the array 202 described in FIG. 2. The array portion 502 can be a portion of a physical block of memory cells that includes multiple decks.

While the array 502 illustrated in FIG. 5 is generally analogous to the array 402 illustrated in FIG. 4, the array 502 includes 3 erase blocks 505-1, 505-2, and 505-3. For example, the array 502 includes a plurality/group of word lines 522-1T, 522-2T, . . . , 522-XT corresponding to a first erase block 505-1 (e.g., a top deck), a plurality/group of word lines 522-1M, 522-2M, . . . , 522-YM corresponding to a second erase block 505-2 (e.g., a middle deck), and a plurality/group of word lines 522-1B, 522-2B, . . . , 522-ZB corresponding to a third erase block 505-3 (e.g., bottom deck). The designators "X", "Y" and "Z" can represent various numbers (e.g., 3 or more) and "X", "Y", and "Z" can be the same number. Accordingly, embodiments are not limited to a particular quantity of word lines 522 for the top deck 505-1, middle deck 505-2, or bottom deck 505-3 (the designator "T" corresponding to "top", the designator "M" corresponding to "middle", and the designator "B" corresponding to "bottom"). The array 502 also includes a first number of dummy word lines 531-1-1, 531-1-2 (collectively referred to as first dummy word lines 531) and a second number of dummy word lines 531-2-1, 531-2-2 (collectively referred to as second dummy word lines 531). The first dummy word lines 531-1-1, 531-1-2 correspond to a separation region 533-1 between the top deck 505-1 and middle deck 505-2 and the second dummy word lines 531-2-1, 531-2-2 correspond to a separation region 533-2 between the middle deck 505-2 and the bottom deck 505-3. Although two word lines 531 are illustrated for each separation region 533, embodiments can include more or fewer than two dummy word lines 531 separating erase blocks corresponding to same strings. Further, although the separation region 533 is illustrated as not being part of the decks 505-1, 505-2, and 505-3, embodiments are not so limited. For example, the region 533-1 can be considered as part of the deck 505-1 or 505-2 and the region 533-2 can be considered as part of the deck 505-2 or 505-3.

The array portion 504 illustrates two strings 525-1 and 525-2 for ease of illustration; however, embodiments can include many more strings 525. Memory cells are located at the intersections of the word lines 522/531 and strings 525, with the memory cells of a particular string 525 sharing a common channel region (e.g., pillar) as described in FIG. 2. The dummy word lines 531 can be coupled to dummy memory cells (e.g., cells that are not addressable to store user data).

As illustrated in FIG. 5, a first end of the strings 525-1 and 525-2 can be coupled to a common source line 429 via respective select gate source lines 527-1 (SGS1) and 527-2 (SGS2). The second/opposite end of the strings 525-1 and 525-2 can be coupled to a bit line 520 via respective select gate drain lines 526-1 (SGD1) and 526-2 (SGD2). As such, the strings 525 (e.g., the cells thereof) can be individually accessed using the bit line 520 and select gates to which the lines 526-1 and 526-2 are coupled. Although only a single bit line 520 is shown, embodiments can include multiple bit lines such as shown in FIG. 2, for example.

As noted herein, in various embodiments, the top deck 505-1, the middle deck 505-2, and the bottom deck 505-3 can be erased via separate erase operations even though the cells of the decks 505-1/505-2/505-3 share the same strings 525-1/525-2. For example, an erase operation can be performed on the cells coupled to word lines 522-1T to 522-XT without erasing the cells coupled to the word lines 522-1M to 522-YM and/or the word lines 522-1B to 522-ZB, and vice versa. Similarly, each one of the decks 505-1, 505-2, 505-3 can be individually programmed and/or read without programming or reading the other of the decks 505-1, 505-2, 505-3.

An erase operation performed on a deck 505-1, 505-2, or 505-3 can include generating GIDL holes at SGDs 526-1 and 526-2 by applying a relatively high voltage (e.g., 20V) to the bit line 520 and carrying GIDL holes through the strings 525-1 and 525-2. The GIDL holes carried through the strings 525-1 and 525-2 are induced to tunnel from the strings 525-1 and 525-2 to (e.g., charge storage regions) of the memory cells of the selected deck 505-1, 505-2, or 505-3.

In one example, an erase operation performed on a selected top deck 505-1 can include applying a relatively high voltage (e.g., 20V) to the bit line 520, applying relatively low voltages (e.g., 0.5V) to the selected word lines 522-1T to 522-XT, and applying relatively high voltages (e.g., 16 or 20V) to the word lines 522-1M to 522-YM of the unselected deck 505-2 as well as to the word lines 522-1B to 522-ZB of the unselected deck 505-3. A voltage level of the relatively high voltages (e.g., applied to the word lines 522-1M to 522-YM and the word lines 522-1B to 522-ZB) can be sufficiently high enough to block GIDL holes generated at select transistors (e.g., select transistors 224, 228 illustrated in FIG. 2) coupled to the SGDs 526-1, 526-2 or the SGSs 527-1, 527-2 from being carried through those portions of the strings 525-1 and 525-2 corresponding to separate regions 533-1, 533-2 and unselected decks 505-2, 505-3; thereby, retaining data stored on the unselected decks 505-2 and 505-3.

In a different example, an erase operation performed on a selected middle deck 505-2 can include applying a relatively high voltage (e.g., 20V) to the bit line 520, applying relatively low voltages (e.g., 0.5V) to the selected word lines 522-1M to 522-YM, applying relatively high voltages (e.g., 16V) to the word lines 522-1T to 522-XT of the unselected deck 505-1, applying relatively high voltages (e.g., 16 or 20V) to the word lines 522-1B to 522-ZB of the unselected deck 505-3. A voltage level of the relatively high voltages (e.g., applied to the word lines 522-1T to 522-XT) can be sufficiently high enough to block GIDL holes (that have been traveling through the strings 525-1 and 525-2) from being tunneled into memory cells of the unselected decks (e.g., deck 505-1), while being low enough to allow GIDL holes to be carried through the strings 525-1 and 525-2 (e.g., portions of the strings 525-1 and 525-2 corresponding to the unselected deck 505-1). Further, a voltage level of the relatively high voltages (e.g., applied to the word lines 522-1B to 522-ZB) can be sufficiently high enough to block GIDL holes generated at select transistors (e.g., select transistors 224, 228 illustrated in FIG. 2) coupled to the SGDs 526-1, 526-2 or the SGSs 527-1, 527-2 from being carried through those portions of the strings 525-1 and 525-2 corresponding to the unselected deck 505-3; thereby, retaining data stored on the unselected deck 505-3.

In a different example, an erase operation performed on a selected bottom deck 505-3 can include applying a relatively high voltage (e.g., 20V) to the bit line 520, applying relatively low voltages to the word lines 522-1B to 522-ZB of the selected deck 505-3, and applying relatively high voltages (e.g., 16V) to the word lines 522-1T to 522-XT of the unselected deck 505-1 as well as to the word lines 522-1M to 522-YM of the unselected deck 505-2. A voltage level of the relatively high voltages (e.g., applied to the word lines 522-1T to 522-XT and the word lines 522-1M to 522-YM) can be sufficiently high enough to block GIDL holes (that have been traveling through the strings 525-1 and 525-2) from being tunneled into memory cells of the unselected decks (e.g., decks 505-1 and 505-2), while being low enough to allow GIDL holes to be carried through the strings 525-1 and 525-2 (e.g., portions of the strings 525-1 and 525-2 corresponding to the unselected decks 505-1 and 505-2).

A voltage level of word line voltages applied to the unselected deck (e.g., top deck, such as top deck 405-1, 505-1 and/or a middle deck 505-2 respectively illustrated in FIGS. 4-5) and/or erase voltages (e.g., a voltage at which the sense line is biased during erase operations and alternatively referred to as "channel voltage") for erasing a selected deck (e.g., bottom deck such as bottom deck 405-2, 505-3 or a middle deck 505-2 respectively illustrated in FIGS. 4-5) can be carefully configured to avoid limited hole passing capability through the top deck (e.g., due to undesirably low electrical field on the top deck) or undesired effects of erase disturb on the top decks (e.g., due to undesirably high electrical field on the top deck). For example, a high limit of the electrical field (which can be often proportional to a difference between voltage levels respectively of the channel voltage and word line voltage) so as not to cause the erase disturb on the top deck can often be affected/limited by a number of program/erase (P/E) cycles. For example, the greater number of erase pulses having previously been applied to memory cells, the lower the high limit of the electrical field, which can further limit a range (alternatively referred to as "window") of the voltage levels of the word line voltage and/or erase voltage.

Several different schemes can be employed (e.g., separately or any combination thereof) to preemptively avoid the erase disturb (e.g., the reduced window of the word line voltages). In one example, word line voltages can be dynamically adjusted by configuring trimming parameters associated with the word line voltages to avoid the electrical field on the top deck being too high to incur the erase disturb on the top deck. For example, a voltage level of the word line voltage (e.g., applied to word lines of the top deck) can be adjusted based on a number of P/E cycles of the top deck so as not to cause the erase disturb (that would have been occurred with the application of unadjusted word line voltages due to the reduced window) on the top deck. In some embodiments, a memory system controller (e.g., the memory system controller 791 illustrated in FIG. 7) can include a lookup table (e.g., stored in an erase component 796 illustrated in FIG. 7) that indicates a corresponding voltage level (to which a word line voltage is to be adjusted) at a respective number of P/E cycles. Although embodiments are not so limited, the trimming parameters can be managed in a unit of a memory die (so that multiple memory dice can be operated with different values of trimming parameters).

In another example, the more number of P/E cycles and/or erase pulses memory cells are subjected to, the greater number of erase pulses may be required to ensure erasure of the memory cells. This multiple erase pulses applied at each cycle can further accelerate the timing at which the memory cells will experience the erase disturb. Accordingly, a voltage level of the channel voltage can be dynamically adjusted based on a number of P/E cycles so as not to apply multiple pulses for a single erase operation (e.g., cycle) and to ensure "1 pulse erase" (e.g., no more than a particular quantity of voltage pulses) at all cycles.

In another example, there can be a process (e.g., manufacturing) change to allow a top deck harder to erase (by causing memory cells of the top deck to have an increased threshold voltage) as compared to a bottom deck. As an example, the process change can involve thickening the tunnel oxide layer (e.g., Band-Engineered Oxide layer) of the memory cells (of the top deck), which can reduce the ease of electron tunneling during the erase operation. This can reduce erase disturb effects at the top deck while maintaining the operational characteristics of the memory cells of the top deck, such as the hole passing capability, Vt window, etc.

Additionally, embodiments of the present disclosure provides management of negative effects of threshold voltage drift (which can be worsened over time since memory cells are read once so that the longer time the memory cells are not read (but are passing GIDL holes to erase a different deck), the worsened threshold voltage drift the memory cells experience). For example, a dummy read operation and/or read reset can be often performed on the memory cells (e.g., coupled to one or more word lines and/or of decks) to prevent a time period between two read operations performed on the memory cells from being undesirably longer and to prevent the threshold voltage drift from being worsening.

FIG. 6 is a flow diagram that illustrates an example method 650 for selectively erasing one of multiple erase blocks coupled to a same string using GIDL in accordance with various embodiments of the present disclosure. The method 650 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 650 is performed by the control circuitry 110 of FIG. 1 and/or the controller 791 of FIG. 7. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 650 is directed to performing an erase operation on a memory array (e.g., the memory array 102, 202, 302, 402, 502 illustrated in FIGS. 1-5) comprising a first erase block (e.g., erase block 305-1, 405-1 illustrated in FIGS. 3-5) and a second erase block (e.g., erase block 405-2, 505-2 illustrated in FIGS. 3-5) that are coupled to one or more first strings (e.g., strings 225, 425, 525 illustrated in FIGS. 2 and 4-5). At block 652, the method 650 includes applying a voltage having a first value (e.g., 20V) to a sense line (e.g., sense line 220, 420, 520 illustrated in FIGS. 1-5) to generate GIDL holes at one or more select transistors (e.g., select transistors 224 illustrated in FIG. 2) and to selectively erase the second erase block 405-2, 505-2 independently of the first erase block 405-1, 505-1 (e.g., without erasing the first erase block). The first erase block 405-1, 505-1 can include a first group of memory cells (e.g., memory cells 223 illustrated in FIG. 2) coupled to a first group of access lines (e.g., word lines 422-1T, . . . , 422-NT, 522-1T, . . . , 522-XT illustrated in FIGS. 4-5) and the one or more first strings 225, 425, 525 and the second erase block 405-2, 505-2 can include a second group of memory cells (e.g., memory cells 223 illustrated in FIG. 2) coupled to a second group of access lines (e.g., word lines 422-1B, . . . , 422-MB, 522-1M, . . . , 522-YM illustrated in FIGS. 4-5) and the one or more first strings 225, 425, 525. Further, the first group of access lines 422-1T, . . . , 422-NT, 522-1T, . . . , 522-XT and the second group of access lines 422-1B, . . . , 422-MB, 522-1M, . . . , 522-YM are separated by dummy access lines (e.g., dummy word lines 431, 531 illustrated in FIGS. 4-5) and the first group of access lines 422-1T, . . . , 422-NT, 522-1T, . . . , 522-XT are located between the sense line 420, 520 and the dummy access lines 431, 531.

At block 654, the method 650 includes applying an intermediate voltage having a second value (e.g., 16V) less than the first value to the first group of access lines 422-1T, . . . , 422-NT, 522-1T, . . . , 522-XT to carry the GIDL holes through the first group of access lines 422-1T, . . . , 422-NT, 522-1T, . . . , 522-XT while retaining data stored on the first erase block 405-1, 505-1. At block 656, the method 650 includes applying a voltage having a third value (e.g., 0.5V) less than the second value (e.g., 16V) to the second group of memory cells 223 to reduce Vt levels of memory cells of the second erase block 405-2, 505-2.

In an alternative embodiment, an erase operation can be selectively on the first erase block 405-1, 505-1 and independently of the second erase block 405-2, 505-2 (e.g., without erasing the second erase block). In this example, the method 650 includes applying a voltage having the first value (e.g., 20V) to the sense line 220, 420, 520 coupled to the one or more first strings 225, 425, 525 to generate GIDL holes at the one or more select transistors 224. The method 650 can further include applying a voltage having the third value (e.g., 0.5V) to the first group of access lines 422-1T, . . . , 422-NT, 522-1T, . . . , 522-XT to remove electrical charges stored on the first erase block 405-1, 505-1. The method can further include applying a voltage having a value (e.g., 16V or 20V) equal to or higher than the second value to the second group of access lines 422-1B, . . . , 422-MB, 522-1M, . . . , 522-YM to block GIDL holes generated from a source line (e.g., source line 229, 429, 529 illustrated in FIGS. 2, 4-5) from being carried through the one or more first strings 225, 425, 525 and retain data stored on the second erase block 405-2, 505-2.

In some embodiments, the memory array 102, 202, 302, 402, 502 can further include a third erase block (e.g., erase block 505-3 illustrated in FIG. 5) comprising a third group of memory cells (e.g., memory cells 223 illustrated in FIG. 2) coupled to a third group of access lines (e.g., word lines 522-1B, 522-2B, . . . , 522-ZB illustrated in FIG. 5) and the one or more first strings 525. The memory array 502 can further include one or more second dummy access (e.g., dummy word lines 531-2-1, 531-2-2 illustrated in FIG. 5) located between the second group of access line lines 522-1M, . . . , 522-YM and the third group of access lines 522-1B, 522-2B, . . . , 522-ZB. The third group of access lines 522-1B, 522-2B, . . . , 522-ZB can be located between the one or more second dummy access lines 531-2-1, 531-2-2 and a source line (e.g., source line 529 illustrated in FIG. 5).

Continuing with this example, an erase operation can be performed selectively on the third erase block 505-3 and independently of the first and second erase blocks 505-1 and 505-2 (e.g., without erasing first and second erase blocks 505-1 and 505-2). In this example, the method 650 can include applying a voltage having the first value (e.g., 20V) to the sense line 520 coupled to the one or more first strings 525 to generate GIDL holes at the one or more select transistors 224. The method 650 can further include applying an intermediate voltage having the second value (e.g., 16V) to the first and second groups of access lines 522-1T, . . . , 522-XT and 522-1M, 522-YM to carry the GIDL holes through the first and second groups of access lines 522-1T, 522-XT and 522-1M, . . . , 522-YM while retaining data stored on the first and second erase blocks 505-1 and 505-2. The method 650 can further include applying a voltage having the third value (e.g., 0.5V) to the third group of access lines 522-1B, 522-2B, . . . , 522-ZB to reduce Vt levels of memory cells of the third group of memory cells. In some embodiments, the method 650 can further include performing an erase operation selectively on the first erase block 505-1 or the second erase block 505-2 by applying, while applying the voltage having the third value (e.g., 0.5V) to the second group of memory cells, an intermediate voltage having the second value (e.g., 16V) to the third group of access lines 522-1B, 522-2B, . . . , 522-ZB to block GIDL holes generated at select transistors (e.g., select transistors 228 illustrated in FIG. 2) coupled to a source line from being carried through the one or more first strings 525 and retain data stored on the third erase block.

Figure 7:
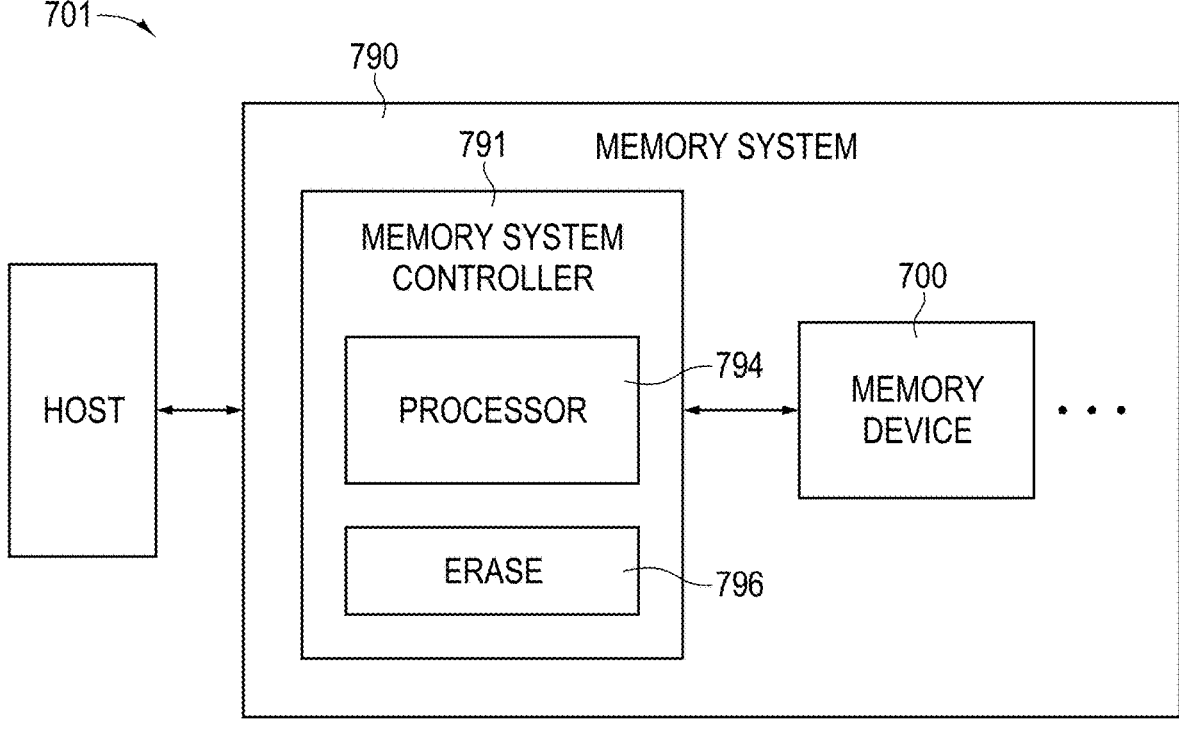
FIG. 7 illustrates an example computing system having a memory system for selectively erasing one of multiple erase blocks coupled to a same string using GIDL in accordance with various embodiments of the present disclosure.

FIG. 7 illustrates an example computing system 701 having a memory system 790 for selectively erasing one of multiple erase blocks coupled to a same string using GIDL in accordance with various embodiments of the present disclosure. As shown in FIG. 7, the memory system 790 includes a system controller 791 and a number of memory devices 700, which can be memory devices such as device 100 described in FIG. 1 (e.g., memory devices comprising memory arrays having multiple erase blocks coupled to common strings).

In some embodiments, the memory system 790 is a storage system. An example of a storage system is a solid-state drive (SSD). In some embodiments, the memory system 790 is a hybrid memory/storage sub-system. In general, the computing environment shown in FIG. 7 can include a host system 792 that uses the memory system 790. For example, the host system 792 can write data to the memory system 790 and read data from the memory system 790.

The memory system controller 791 (hereinafter referred to as "controller") can communicate with the memory devices 700 to perform operations such as reading data, writing data, or erasing data at the memory devices 700 and other such operations. The controller 791 can include hardware such as one or more integrated circuits and/or discrete components, a buffer memory, or a combination thereof. The controller 700 can include a microcontroller, special purpose logic circuitry (e.g., a field programmable gate array (FPGA), an application specific integrated circuit (ASIC), etc.), or other suitable processing circuitry. The controller 700 can include a processing device (e.g., processor 794) configured to execute instructions stored in local memory (not shown).

In this example, the controller 791 includes an erase component 796 that can be responsible for facilitating performance of erase operations selectively on one of erase blocks coupled to a same string using GIDL holes. In some embodiments, the erase component 796 can include special purpose circuitry in the form of an ASIC, FPGA, state machine, and/or other logic circuitry that can allow the erase component 796 to orchestrate and/or perform operations described herein involving the memory device 700. The erase component 796 can further include storage locations (e.g., memory cells, latches, capacitors, etc.) that can be configured to store trim values (e.g., parameters) associated with those voltages (e.g., a voltage applied to a sense line, voltages applied to selected/unselected word lines, etc.) applied during performance of erase operations.

In general, the controller 791 can receive commands or operations from the host system 792 and can convert the commands or operations into instructions or appropriate commands to achieve the desired access to the memory devices 700. The controller 791 can be responsible for other operations such as wear leveling operations, garbage collection operations, error detection and error-correcting code (ECC) operations, encryption operations, caching operations, and address translations between a logical block address and a physical block address that are associated with the memory devices 700.

The host system 792 can be a computing device such as a desktop computer, laptop computer, network server, mobile device, or other such computing device that includes a memory and a processing device. The host system 792 can include, or be coupled to, the memory system 790 so that the host system 792 can read data from or write data to the memory system 790. The host system 792 can be coupled to the memory system 790 via a physical host interface (not shown in FIG. 7). As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), etc. The physical host interface can be used to transmit data between the host system 792 and the memory system 790. The host system 792 can further utilize an NVM Express (NVMe) interface to access the memory devices 700 when the memory system 790 is coupled with the host system 792 by the PCIe interface. The physical host interface can provide an interface for passing control, address, data, and other signals between the memory system 790 and the host system 792.

While the example memory system 790 in FIG. 7 has been illustrated as including the controller 791, in another embodiment of the present disclosure, a memory system 790 may not include a controller 791, and can instead rely upon external control (e.g., provided by a processor or controller separate from the memory system 790, such as by host 792 communicating directly with the memory devices 700).

Although the memory system 790 is shown as physically separate from the host 792, in a number of embodiments the memory system 790 can be embedded within the host 792. Alternatively, the memory system 790 can be removable from the host 792.

As used herein, an "apparatus" can refer to various structural components. For example, the computing system 701 shown in FIG. 7 can be considered an apparatus. Alternatively, the host 792, the controller 704, and the memory device 700 might each separately be considered an apparatus.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. As will be appreciated, elements shown in the various embodiments herein can be added, exchanged, and/or eliminated so as to provide a number of additional embodiments of the present disclosure.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C). Additionally, the phrase "at least one of A and B" means one or more of (A) or one or more of (B), or one or more of (A) and one or more of (B) such that both one or more of (A) and one or more of (B) is not required.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   a memory array comprising a plurality of strings of memory cells, wherein a first string of the plurality of strings comprises:
      a first group of memory cells coupled to a first group of access lines and corresponding to a first erase block; and
      a second group of memory cells coupled to a second group of access lines and corresponding to a second erase block; and
   a controller coupled to the memory array and configured to, in order to selectively erase the second erase block independently of the first erase block:
      apply, to generate gate induced drain leakage (GIDL) holes, a voltage having a first value to a sense line coupled to the plurality of strings;
      apply, to carry the GIDL holes through the first group of access lines and retain data stored on the first erase block, a voltage having a second value less than the first value to the first group of access lines; and
      apply, to erase data stored on the second erase block, a voltage having a third value less than the second value to the second group of access lines.

2. The apparatus of claim 1, wherein the controller is configured to, in order to selectively erase the first erase block independently of the second erase block:

apply, to generate GIDL holes, a voltage having the first value to the sense line coupled to the plurality of strings;

apply, to erase data stored on the first erase block, a voltage having the third value less than the second value to the first group of access lines; and apply, to block GIDL holes from being carried from one or more select gate sources through the first string and retain data stored on the second erase block, a voltage having the second value to the second group of access lines.

3. The apparatus of claim 1, wherein:

the first string further comprises one or more dummy memory cells coupled to one or more respective dummy access lines located between the first group of access lines and the second group of access lines the first group of access lines are located between the sense line and the one or more dummy access lines; and the second group of access lines are located between a source line and the one or more dummy access lines.

4. The apparatus of claim 1, wherein:

the first string further comprises one or more dummy memory cells coupled to one or more respective dummy access lines located between the first group of access lines and the second group of access lines;

the first group of access lines are located between a source line and the one or more dummy access lines; and the second group of access lines are located between the sense line and the one or more dummy access lines.

5. The apparatus of claim 1, wherein:

the first string further comprises a third group of memory cells coupled to a third group of access lines and corresponding to a third erase block; and the controller is configured to apply, to carry the GIDL holes through the third group of access lines and retain data stored on the third erase block, a voltage having the second value to the third group of access lines.

6. The apparatus of claim 1, wherein:

the first string further comprises a third group of memory cells coupled to a third group of access lines and corresponding to a third erase block; and the first string further comprises:

one or more first dummy memory cells coupled to one or more respective first dummy access lines located between the first group of access lines and the third group of access lines; and one or more second dummy memory cells coupled to one or more respective second dummy access lines located between the second group of access lines and the third group of access lines.

7. The apparatus of claim 6, wherein:

the first group of access lines are located between the sense line and the one or more first dummy access lines; and the second group of access lines are located between a source line and the one or more second dummy access lines.

8. The apparatus of claim 6, wherein the controller is configured to, in order to selectively erase the third erase block independently of the first and second erase blocks:

apply, to generate GIDL holes, a voltage having the first value to the sense line coupled to the plurality of strings;

apply, to carry the GIDL holes through the first group of access lines and retain data stored on the first erase block, a voltage having the second value to the first group of access lines;

apply, to erase data stored on the third erase block, a voltage having the third value to the third group of access lines; and apply, to block GIDL holes from being carried from one or more select gate sources through the first string, a voltage having a fourth value equal to or higher than the second value.

9. The apparatus of claim 1, wherein the controller is configured to dynamically adjust a voltage level of a voltage to be applied to at least a portion of the first group of access lines or second group of access lines for erasure of the first erase block or the second erase block based on a number of program/erase (P/E) cycles seen by the first erase block or the second erase block, in order to optimize the conditions based on the changes in characteristics related to the number of P/E cycles experienced.

10. The apparatus of claim 1, wherein the controller is configured to dynamically adjust a voltage level of a voltage to be applied to the sense line or a source line coupled to the plurality of strings for erasure of the first erase block or the second erase block based on a number of program/erase (P/E) cycles seen by the first erase block or the second erase block, so as to apply not more than a particular quantity of voltage pulses per each program/erase (P/E) cycle in erasing the corresponding first erase block or the second erase block.

11. The apparatus of claim 1, wherein memory cells of the first erase block are configured to have an increased threshold voltage level as compared to that of memory cells of the second erase block.

12. A method for performing an erase operation on a memory array comprising a first erase block and a second erase block that are coupled to one or more first strings, the method comprising:

applying a voltage having a first value to a sense line to selectively erase the second erase block independently of the first erase block to generate gate induced drain leakage (GIDL) holes at one or more select transistors coupled to the sense line, wherein:

the first erase block comprises a first group of memory cells coupled to a first group of access lines and the one or more first strings; and the second erase block comprises a second group of memory cells coupled to a second group of access lines and the one or more first strings, wherein:

the first group of access lines and the second group of access lines are separated by dummy access lines; and the first group of access lines are located between the sense line and the dummy access lines;

applying a voltage having a second value less than the first value to the first group of access lines to carry the GIDL holes through the first group of access lines while retaining data stored on the first erase block; and applying a voltage having a third value less than the second value to the second group of memory cells to reduce a threshold voltage level of the second group memory cells.

13. The method of claim 12, further comprising performing, subsequent to performing a memory operation on the first erase block or the second erase block, a dummy read operation on the first erase block or the second erase block to prevent a time period between the memory operation and the dummy read operation from being longer than a threshold period so as to prevent a threshold voltage drift associated with the first erase block or the second erase block form worsening.

14. The method of claim 12, further comprising performing an erase operation selectively on the first erase block and independently of the second erase block by:

applying a voltage having the first value to the sense line coupled to the one or more first strings to generate GIDL holes at the one or more select transistors;

applying a voltage having the third value to the first group of access lines; and applying a voltage having a value equal to or higher than the second value to the second group of access lines to block GIDL holes generated from one or more select transistors coupled to a source line from being carried through the one or more first strings and retain data stored on the second erase block.

15. The method of claim 12, wherein the memory array further comprises:

a third erase block comprising a third group of memory cells coupled to a third group of access lines and the one or more first strings; and one or more second dummy access lines located between the second group of access line and the third group of access lines, wherein the third group of access lines are located between the one or more second dummy access lines and a source line.

16. The method of claim 15, further comprising performing an erase operation selectively on the third erase block and independently of the first and second erase blocks by:

applying a voltage having the first value to the sense line coupled to the one or more first strings to generate GIDL holes at the one or more select transistor;

applying a voltage having the second value to the first and second groups of access lines to carry the GIDL holes through the first and second groups of access lines while retaining data stored on the first and second erase blocks; and applying a voltage having the third value to the second group of memory cells to reduce a threshold voltage level of the second group of memory cells.

17. The method of claim 15, further comprising performing an erase operation selectively on the first erase block or the second erase block by applying, while applying the voltage having the third value to the first group of memory cells or the second group of memory cells, a voltage having the second value to the third group of access lines to block GIDL holes from being carried from one or more select gate sources through the one or more first strings and retain data stored on the third erase block.

18. An apparatus, comprising:

a memory array comprising a plurality of physical blocks of memory cells, each physical block of memory cells of the plurality of physical blocks comprising a plurality of strings of memory cells, wherein a first string of the plurality of strings corresponds to multiple erase blocks of a particular physical block that are erasable at different times, and wherein the first string comprises:

a first group of memory cells coupled to a first group of access lines and corresponding to a first erase block of the multiple erase blocks;

a second group of memory cells coupled to a second group of access lines and corresponding to a second erase block; and a first number of dummy access lines separating the first group of access lines from the second group of access lines; and a controller coupled to the memory array and configured to, in order to selectively erase the second erase block independently of the first erase block:

apply a voltage having a first value to a sense line to generate gate induced drain leakage (GIDL) holes;

apply a voltage having a second value less than the first value to the first group of access lines to carry the GIDL holes through the first group of access lines and retain data stored on the first erase block; and apply a voltage having a third value less than the second value to the second group of access lines to reduce a threshold voltage level of the second group of memory cells.

19. The apparatus of claim 18, wherein:

the first string further comprises:

a third group of memory cells coupled to a third group of access lines and corresponding to a third erase block of the multiple erase blocks; and a second number of dummy access lines separating the second group of access lines and the third group of access lines;

the controller is further configured to, in order to selectively erase the third erase block independently of the first and second erase blocks:

apply a voltage having the first value to the sense line to generate GIDL holes;

apply a voltage having the second value less than the first value to the first and second groups of access lines to carry the GIDL holes through the first and second groups of access lines and retain data stored on the first and second erase blocks; and apply a voltage having a third value less than the second value to the third group of access lines to reduce a threshold voltage level of the third group of memory cells.

20. The apparatus of claim 18, wherein:

the first string further comprises:

a third group of memory cells coupled to a third group of access lines and corresponding to a third erase block of the multiple erase blocks; and a second number of dummy access lines separating the second group of access lines and the third group of access lines;

the controller is further configured to, in order to selectively erase the second erase block independently of the first and third erase blocks:

apply, to the sense line a voltage having the first value to generate GIDL holes;

apply, to the first and third groups of access lines, a voltage having the second value less than the first value to carry the GIDL holes through the first and second groups of access lines and retain data stored on the first and second erase blocks; and apply, to the second group of access lines, a voltage having a value equal to or greater than the second value to block GIDL holes from being carried from one or more select gate sources through the first string and retain data stored on the second erase block.

* * * * *